United States Patent
Hanamaki et al.

(10) Patent No.: US 7,759,148 B2
(45) Date of Patent: Jul. 20, 2010

(54) METHOD FOR MANUFACTURING SEMICONDUCTOR OPTICAL DEVICE

(75) Inventors: Yoshihiko Hanamaki, Tokyo (JP); Kenichi Ono, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 335 days.

(21) Appl. No.: 11/837,676

(22) Filed: Aug. 13, 2007

(65) Prior Publication Data

US 2008/0227233 A1  Sep. 18, 2008

(30) Foreign Application Priority Data

Mar. 16, 2007  (JP) ............... 2007-068538

(51) Int. Cl.
*H01L 21/00* (2006.01)

(52) U.S. Cl. .......... 438/45; 438/369; 438/371; 438/510; 438/514; 438/519; 257/102; 257/607; 257/E31.021; 257/E33.001

(58) Field of Classification Search ............ 438/45, 438/350, 369, 371, 510, 514, 519; 257/102, 257/607, E31.021, E33.001
See application file for complete search history.

(56) References Cited

U.S. PATENT DOCUMENTS

| | | | |
|---|---|---|---|
| 4,680,602 A * | 7/1987 | Watanabe et al. ............ 257/13 |
| 5,430,310 A * | 7/1995 | Shibasaki et al. ........... 257/190 |
| 6,350,997 B1 | 2/2002 | Saeki | |
| 6,750,120 B1 * | 6/2004 | Kneissl et al. .............. 438/479 |
| 7,622,745 B2 * | 11/2009 | Suzuki ........................ 257/96 |
| 2006/0220037 A1 | 10/2006 | Hanamaki et al. | |
| 2007/0181905 A1 * | 8/2007 | Wang et al. ................. 257/103 |
| 2007/0230530 A1 * | 10/2007 | Kashima et al. .......... 372/46.01 |
| 2007/0258498 A1 * | 11/2007 | Kawahara et al. ........ 372/46.01 |
| 2008/0257409 A1 * | 10/2008 | Li et al. ...................... 136/259 |

FOREIGN PATENT DOCUMENTS

| | | |
|---|---|---|
| JP | 10-308551 | 11/1998 |
| JP | 11-307810 | 11/1999 |
| JP | 2001-144322 | 5/2001 |
| JP | 2005-85848 | 3/2005 |

\* cited by examiner

*Primary Examiner*—Matthew C Landau
*Assistant Examiner*—Colleen E Snow
(74) *Attorney, Agent, or Firm*—Leydig, Voit & Mayer, Ltd.

(57) ABSTRACT

A method for manufacturing a semiconductor optical device includes forming a BDR (Band Discontinuity Reduction) layer of a first conductivity type doped with an impurity, depositing a contact layer of the first conductivity type in contact with the BDR layer after forming the the BDR layer, the contact layer being doped with the same impurity as the BDR layer and used to form an electrode, and heat treating after forming the contact layer.

5 Claims, 6 Drawing Sheets

| No | name of layer | material | dopant | carrier density[E18/cm3] | thickness[nm] |
|---|---|---|---|---|---|
| 12 | contact layer | GaAs | C and Zn | 20.0-40.0 | 100-400 |
| 11 | BDR layer | InGaP | Zn | 3.0-6.0 | 10-60 |
| 10 | cladding layer | AlGaInP | Zn | 0.5-3.0 | 500-1500 |
| 9 | cladding layer | InGaP | Zn | 0.5-3.0 | 10-100 |
| 8 | cladding layer | AlGaAs | Zn | 0.5-2.0 | 100-200 |
| 7 | guiding layer | AlGaAs | | ------- | 5-20 |
| 6 | well layer | AlGaAs | | ------- | 5-10 |
| 5 | guiding layer | AlGaAs | | ------- | 5-20 |
| 4 | cladding layer | AlGaAs | Si | 0.05-0.2 | 50-200 |
| 3 | cladding layer | InGaP | Si | 0.1-0.5 | 1000-4000 |
| 2 | buffer layer | GaAs | Si | 0.5-2.0 | 200-700 |
| 1 | substrate | GaAs | Si | 0.7-1.0 | |

| No | name of layer | material | dopant | carrier density[E18/cm3] | thickness[nm] |
|---|---|---|---|---|---|
| 12 | contact layer | GaAs | C and Zn | 20.0-40.0 | 100-400 |
| 11 | BDR layer | InGaP | Zn | 3.0-6.0 | 10-60 |
| 10 | cladding layer | AlGaInP | Zn | 0.5-3.0 | 500-1500 |
| 9 | cladding layer | InGaP | Zn | 0.5-3.0 | 10-100 |
| 8 | cladding layer | AlGaAs | Zn | 0.5-2.0 | 100-200 |
| 7 | guiding layer | AlGaAs | | ------- | 5-20 |
| 6 | well layer | AlGaAs | | ------- | 5-10 |
| 5 | guiding layer | AlGaAs | | ------- | 5-20 |
| 4 | cladding layer | AlGaAs | Si | 0.05-0.2 | 50-200 |
| 3 | cladding layer | InGaP | Si | 0.1-0.5 | 1000-4000 |
| 2 | buffer layer | GaAs | Si | 0.5-2.0 | 200-700 |
| 1 | substrate | GaAs | Si | 0.7-1.0 | |

| No | name of layer | material | dopant | carrier density[E18/cm3] | thickness[nm] |
|---|---|---|---|---|---|
| 12 | contact layer | GaAs | C | 20.0-40.0 | 100-400 |
| 11 | BDR layer | InGaP | Zn | 3.0-6.0 | 10-60 |
| 10 | cladding layer | AlGaInP | Zn | 0.5-3.0 | 500-1500 |
| 9 | cladding layer | InGaP | Zn | 0.5-3.0 | 10-100 |
| 8 | cladding layer | AlGaAs | Zn | 0.5-2.0 | 100-200 |
| 7 | guiding layer | AlGaAs | | ------- | 5-20 |
| 6 | well layer | AlGaAs | | ------- | 5-10 |
| 5 | guiding layer | AlGaAs | | ------- | 5-20 |
| 4 | cladding layer | AlGaAs | Si | 0.05-0.2 | 50-200 |
| 3 | cladding layer | InGaP | Si | 0.1-0.5 | 1000-4000 |
| 2 | buffer layer | GaAs | Si | 0.5-2.0 | 200-700 |
| 1 | substrate | GaAs | Si | 0.7-1.0 | |

FIG. 5

| No | name of layer | material | dopant | carrier density [E18/cm3] | thickness [nm] |
|---|---|---|---|---|---|
| 12 | contact layer | GaAs | C and Mg | 20.0-40.0 | 100-400 |
| 11 | BDR layer | InGaP | Mg | 3.0-6.0 | 10-60 |
| 10 | cladding layer | AlGaInP | Mg | 0.5-3.0 | 500-1500 |
| 9 | cladding layer | InGaP | Mg | 0.5-3.0 | 10-100 |
| 8 | cladding layer | AlGaAs | Mg | 0.5-2.0 | 100-200 |
| 7 | guiding layer | AlGaAs | | ------- | 5-20 |
| 6 | well layer | AlGaAs | | ------- | 5-10 |
| 5 | guiding layer | AlGaAs | | ------- | 5-20 |
| 4 | cladding layer | AlGaAs | Si | 0.05-0.2 | 50-200 |
| 3 | cladding layer | InGaP | Si | 0.1-0.5 | 1000-4000 |
| 2 | buffer layer | GaAs | Si | 0.5-2.0 | 200-700 |
| 1 | substrate | GaAs | Si | 0.7-1.0 | |

FIG. 6

| No | name of layer | material | dopant | carrier density [E18/cm3] | thickness [nm] |
|---|---|---|---|---|---|
| 12 | contact layer | GaAs | C and Be | 20.0-40.0 | 100-400 |
| 11 | BDR layer | InGaP | Be | 3.0-6.0 | 10-60 |
| 10 | cladding layer | AlGaInP | Be | 0.5-3.0 | 500-1500 |
| 9 | cladding layer | InGaP | Be | 0.5-3.0 | 10-100 |
| 8 | cladding layer | AlGaAs | Be | 0.5-2.0 | 100-200 |
| 7 | guiding layer | AlGaAs | | ------- | 5-20 |
| 6 | well layer | AlGaAs | | ------- | 5-10 |
| 5 | guiding layer | AlGaAs | | ------- | 5-20 |
| 4 | cladding layer | AlGaAs | Si | 0.05-0.2 | 50-200 |
| 3 | cladding layer | InGaP | Si | 0.1-0.5 | 1000-4000 |
| 2 | buffer layer | GaAs | Si | 0.5-2.0 | 200-700 |
| 1 | substrate | GaAs | Si | 0.7-1.0 | |

FIG. 9

| No | name of layer | material | dopant | carrier density [E18/cm3] | thickness [nm] |
|---|---|---|---|---|---|
| 13 | contact layer | InGaAs | C and Be | 20.0-40.0 | 200-800 |
| 12 | BDR layer | InGaAsP | Be | 3.0-6.0 | 50-200 |
| 11 | cladding layer | InP | Be | 1.0-3.0 | 1000-2000 |
| 10 | cladding layer | InGaAsP | Be | 0.5-1.0 | 20-100 |
| 9 | guiding layer | InGaAsP | | ------- | 80-150 |
| 8 | barrier layer | InGaAsP | | ------- | 5-10 |
| 7 | well layer | InGaAsP | | ------- | 5-10 |
| 6 | barrier layer | InGaAsP | | ------- | 5-10 |
| 5 | guiding layer | InGaAsP | S | 0.5-1.5 | 80-150 |
| 4 | cladding layer | InGaAsP | S | 0.5-1.5 | 20-80 |
| 3 | BDR layer | InGaAsP | S | 0.5-1.5 | 10-50 |
| 2 | buffer layer | InP | S | 0.5-1.5 | 700-1500 |
| 1 | substrate | InP | S | 0.7-1.0 | |

FIG. 10

| No | name of layer | material | dopant | carrier density [E18/cm3] | thickness [nm] |
|---|---|---|---|---|---|
| 13 | contact layer | InGaAs | C and Zn | 20.0-40.0 | 200-800 |
| 12 | BDR layer | InGaAsP | Zn | 3.0-6.0 | 50-200 |
| 11 | cladding layer | InP | Zn | 1.0-3.0 | 1000-2000 |
| 10 | cladding layer | InGaAsP | Zn | 0.5-1.0 | 20-100 |
| 9 | guiding layer | InGaAsP | | ------- | 80-150 |
| 8 | barrier layer | InGaAsP | | ------- | 5-10 |
| 7 | well layer | InGaAsP | | ------- | 5-10 |
| 6 | barrier layer | InGaAsP | | ------- | 5-10 |
| 5 | guiding layer | InGaAsP | S | 0.5-1.5 | 80-150 |
| 4 | cladding layer | InGaAsP | S | 0.5-1.5 | 20-80 |
| 3 | BDR layer | InGaAsP | S | 0.5-1.5 | 10-50 |
| 2 | buffer layer | InP | S | 0.5-1.5 | 700-1500 |
| 1 | substrate | InP | S | 0.7-1.0 | |

FIG. 11

| No | name of layer | material | dopant | carrier density [E18/cm3] | thickness [nm] |
|----|---------------|----------|--------|---------------------------|----------------|
| 13 | contact layer | InGaAs | C and Mg | 20.0-40.0 | 200-800 |
| 12 | BDR layer | InGaAsP | Mg | 3.0-6.0 | 50-200 |
| 11 | cladding layer | InP | Mg | 1.0-3.0 | 1000-2000 |
| 10 | cladding layer | InGaAsP | Mg | 0.5-1.0 | 20-100 |
| 9 | guiding layer | InGaAsP | | ------- | 80-150 |
| 8 | barrier layer | InGaAsP | | ------- | 5-10 |
| 7 | well layer | InGaAsP | | ------- | 5-10 |
| 6 | barrier layer | InGaAsP | | ------- | 5-10 |
| 5 | guiding layer | InGaAsP | S | 0.5-1.5 | 80-150 |
| 4 | cladding layer | InGaAsP | S | 0.5-1.5 | 20-80 |
| 3 | BDR layer | InGaAsP | S | 0.5-1.5 | 10-50 |
| 2 | buffer layer | InP | S | 0.5-1.5 | 700-1500 |
| 1 | substrate | InP | S | 0.7-1.0 | |

METHOD FOR MANUFACTURING SEMICONDUCTOR OPTICAL DEVICE

BACKGROUND OF THE INVENTION

1. Field of the Invention

The present invention relates to a method for manufacturing a semiconductor optical device, and more particularly to a method for manufacturing a semiconductor optical device in such a way that the operating resistance of the device does not deviate from the design value.

2. Background Art

Semiconductor lasers have been widely used in optical disc drives, scanners, copiers, etc. JP-A-11-307810 (1999) discloses such a semiconductor laser, which has two important features. First, this semiconductor laser includes a BDR (Band Discontinuity Reduction) layer disposed between a contact layer and a cladding layer to reduce the band discontinuity between these contact and cladding layers and thereby reduce the device resistance. This BDR layer has an energy bandgap intermediate between the energy bandgaps of the contact layer and the cladding layer. Second, the contact layer is doped with C to reduce the contact resistance between the contact layer and the electrode. Other prior art includes JP-A-2005-85848, JP-A-10-308551, and JP-A-2001-144322.

In conventional semiconductor lasers such as described above, impurities doped into the BDR layer may diffuse into the contact layer due to heat applied during and after the contact layer growth process. This thermal diffusion leads to a reduction in the impurity density of the BDR layer and hence an increase in the operating resistance of the semiconductor optical device, with the result that the operating resistance of the device deviates from the design value.

SUMMARY OF THE INVENTION

The present invention has been devised to solve the above problem. It is, therefore, an object of the present invention to provide a method for manufacturing a semiconductor optical device in such a way as to reduce the impurity diffusion from the BDR layer to the contact layer to prevent the operating resistance of the device from deviating from the design value.

According to one aspect of present invention, a method for manufacturing a semiconductor optical device, includes the following steps. a BDR (Band Discontinuity Reduction) layer forming step for forming a BDR layer of a first conductive type doped with a first impurity, a contact layer forming step for depositing a contact layer of said first conductive type in contact with said BDR layer after said formation for said BDR layer, said contact layer being doped with said first impurity and a second impurity and used to form an electrode, and a heat treatment step for performing a heat treatment after said contact layer forming step.

Other and further objects, features and advantages of the invention will appear more fully from the following description.

BRIEF DESCRIPTION OF THE DRAWINGS

FIG. 5 is a diagram illustrating semiconductor laser using Mg instead of Zn;

FIG. 6 is a diagram illustrating semiconductor laser using Be instead of Zn;

FIGS. 9, 10 and 11 are diagrams illustrating semiconductor laser having an oscillation wavelength of approximately 1250-1580 nm.

DETAILED DESCRIPTION OF THE PREFERRED EMBODIMENTS

First Embodiment

Figures 1, 2:
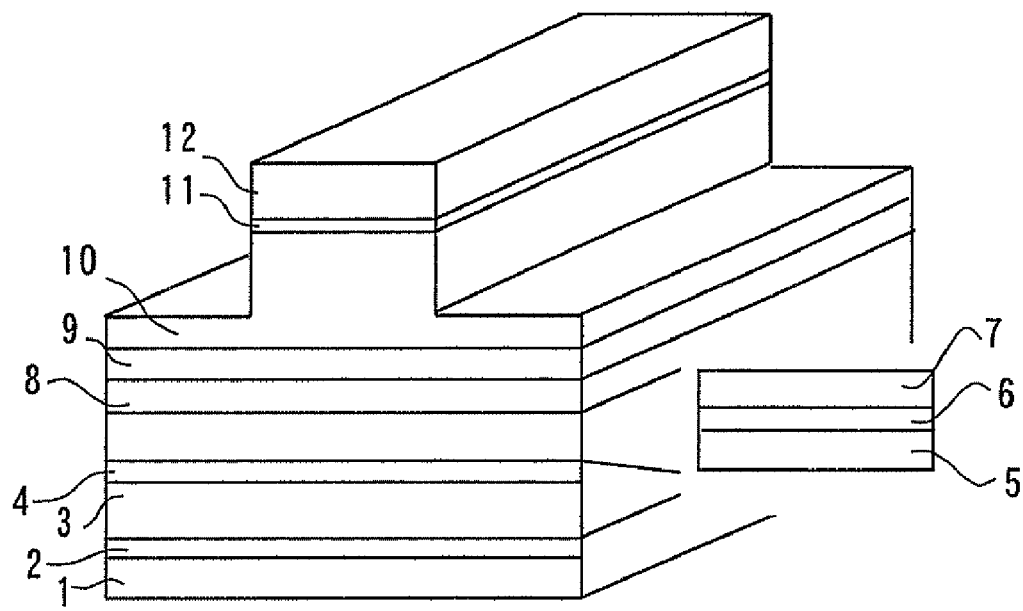
FIG. 1 is a diagram illustrating the configuration of a semiconductor laser according to a first embodiment of the present invention.
FIG. 2 shows the name, material, dopant, carrier concentration, and thickness of each layer in the semiconductor laser.

FIG. 1 is a diagram illustrating the configuration of a semiconductor laser according to a first embodiment of the present invention. It should be noted that in FIGS. 1 and 2, the same reference numerals are used to designate the same layers. FIG. 2 shows the name, material, dopant, carrier concentration, and thickness of each layer in the semiconductor laser. These layers will now be described.

First, a buffer layer 2 of Si—GaAs, i.e., GaAs doped with Si (an n-type dopant), is formed on a GaAs substrate 1. Then, a cladding layer 3 of Si—InGaP (or Si-doped InGaP) is formed on the buffer layer 2, and a cladding layer 4 of Si—AlGaAs (or Si-doped AlGaAs) is formed on the cladding layer 3. The buffer layer is provided to enhance the crystallinity of the device on the substrate. Further, the primary functions of the cladding layers are to increase the carrier densities of the guiding layer and the quantum well layer (formed later) thereon and to confine light within the active layer. It should be noted that Te, Se, etc. may be used as a dopant, instead of Si, with the same effect. Then, a guiding layer 5 of undoped AlGaAs is formed on the cladding layer 4, and a well layer 6 of undoped AlGaAs is formed on the guiding layer 5. After that, a guiding layer 7 of undoped AlGaAs is formed on the well layer 6. It should be noted that the well layer emits light as a result of carrier recombination, and the primary function of the guiding layers is to confine this light within the active layer.

Then, a p-type cladding layer 8 of Zn—AlGaAs, i.e., AlGaAs doped with Zn (a p-type dopant), is formed on the guiding layer 7. After that, a cladding layer 9 of Zn—InGaP (or Zn-doped InGaP) is formed on the cladding layer 8, and a cladding layer 10 of Zn—AlGaInP (or Zn-doped AlGaInP) is formed on the cladding layer 9. Then, a BDR layer 11 of Zn—InGaP (or Zn-doped AlGaInP) is formed on the cladding layer 10, and a p-type contact layer 12 of C—Zn—GaAs (or C- and Zn-doped GaAs) is formed on the BDR layer 11. The C dopant in the contact layer 12 contributes to forming a good ohmic electrode on the contact layer. Further, the primary function of the Zn dopant in the contact layer 12 is to preclude diffusion of Zn from the BDR layer 11.

Figures 3, 4:
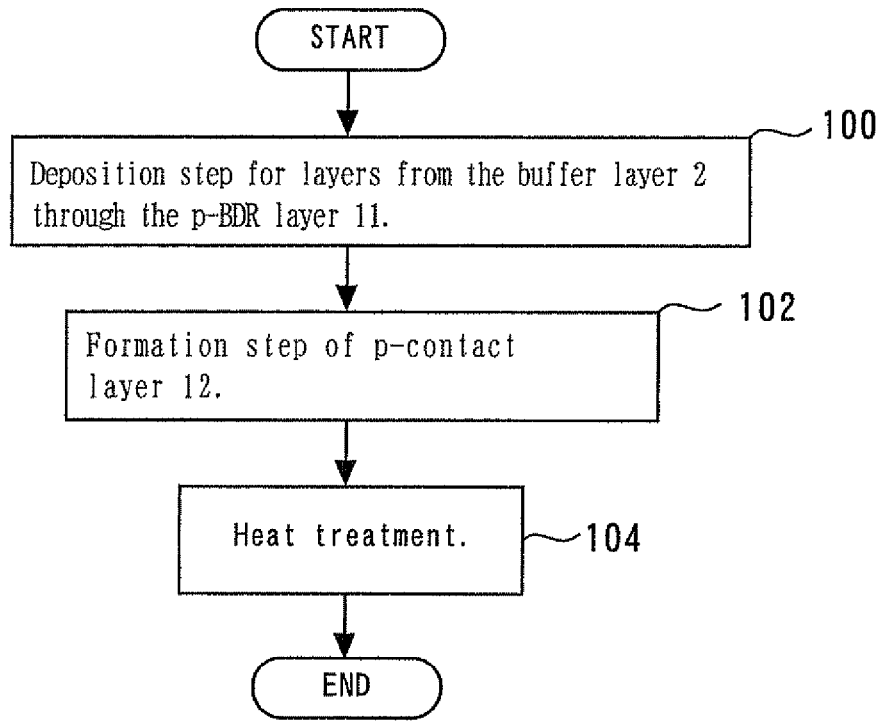
FIG. 3 is a flowchart illustrating a portion of a process for manufacturing the semiconductor laser of the first embodiment.
FIG. 4 is a diagram illustrating a comparative semiconductor laser.

FIG. 3 is a flowchart illustrating a portion of a process for manufacturing the semiconductor laser of the present embodiment. First, in step 100, the layers from the buffer layer 2 through the p-BDR layer 11 are sequentially deposited by MOCVD (Metalorganic Chemical Vapor Deposition) using materials such as trimethyl indium (TMI), trimethyl gallium (TMG), trimethyl aluminum (TMA), phosphine (PH$_3$), arsine (AsH$_3$), silane (SiH$_4$), dimethyl zinc (DMZn), diethyl zinc (DEZn), etc. More specifically, the above layers are grown by mixing these materials with hydrogen gas and supplying them while controlling their flow rate by using a mass flow controller (MFC), etc. It should be noted that heat is applied when these layers are formed in step 100. Then, the p-contact layer 12 is formed in step 102. Heat is also applied in this step. The contact layer 12 is formed in a similar manner to that described above, except that both C and Zn are simultaneously doped into the layer as dopants. More specifically, the Zn-doping into the p-contact layer 12 is done by supplying dimethyl zinc (DMZn) or diethyl zinc (DEZn). On the other hand, the C-doping into the p-contact layer 12 is done by forming the p-contact layer 12 at a growth temperature of 540° C. and an AsH$_3$ to TMG (or V/III) flow rate ratio of approximately 1. In this way, carbon released from methyl groups of the TMG is introduced into the GaAs layer (i.e., the contact layer 12). This type of C doping (hereinafter referred to as "intrinsic doping") is well known in the art and advantageous in that it does not require a separate dopant material. Note that the type of doping that uses a separate dopant material (such as the Zn doping of the present embodiment) is referred to as "intentional doping."

After growing the p-contact layer as described above, the GaAs substrate is retrieved from the MOCVD apparatus and then further treated. At that time, the GaAs substrate is further subjected to heat (Step 104).

The semiconductor laser of the present embodiment, configured as described above, is characterized in that the p-contact layer is doped with Zn in addition to C. This semiconductor laser is compared with a conventional semiconductor laser (a comparative semiconductor laser), shown in FIG. 4, to clarify the advantages of the present invention. The comparative semiconductor laser differs from the semiconductor laser of the present embodiment only in that its p-contact layer does not contain Zn. Therefore, the comparative semiconductor laser is manufactured in a similar manner to the manufacturing process shown in FIG. 3, except that the p-contact layer is not doped with Zn. That is, the manufacturing process for the comparative semiconductor laser also includes the above steps 102 and 104 (shown in FIG. 3), in which heat is applied to the substrate. (This heat is hereinafter referred to as "process heat.") Therefore, also in this comparative semiconductor laser, the Zn dopant in the p-BDR layer may diffuse into the p-contact layer due to the process heat applied in steps 102 and 104. This results in a reduction in the dopant density of the p-BDR layer, causing the device resistance to exceed the design value.

On the other hand, the semiconductor laser of the present embodiment does not have the above problem of diffusion of (Zn) dopant from the p-BDR layer into the p-contact layer due to process heat. Specifically, the Zn dopant in the p-contact layer (which is doped into the layer together with C dopant) prevents diffusion of Zn dopant from the p-BDR layer into the contact layer due to process heat. Such a dopant (doped into the p-contact layer) is hereinafter referred to as a "diffusion preventing dopant." To achieve the above diffusion preventing effect, the diffusion preventing dopant in the p-contact layer must be of the same material as the dopant in the p-BDR layer.

Thus, in the semiconductor laser of the present embodiment shown in FIG. 2, the dopant in the p-contact layer precludes undesired dopant diffusion from the p-BDR layer, avoiding a reduction in the dopant density of the p-BDR layer and hence an increase in the device resistance. This prevents the device resistance from deviating from the design value.

It should be noted that the carbon-induced carrier concentration of the p-contact layer is preferably between 20.0E18 to 40.0E18 cm$^3$. It is more preferable that the amount of diffusion preventing dopant in the p-contact layer is equal to the amount of dopant in the p-BDR layer. However, any amount of diffusion preventing dopant distributed in any manner within the p-contact layer can provide some dopant diffusion preventing effect.

According to the present embodiment, the p-cladding layers 8, 9, and 10 and the p-BDR layer 11 each contain Zn as a dopant, and the p-contact layer 12 also contains Zn as a diffusion preventing dopant. However, in other embodiments, other dopants may be used instead of Zn. For example, the above layers may contain Mg or Be, as shown in FIGS. 5 and 6, and may still achieve the effect of the invention. Cyclopentadienyl magnesium (Cp$_2$Mg) and cyclopentadienyl beryllium (Cp$_2$Be) are used to dope these layers with Mg and Be, respectively. Also in these cases the carbon-induced carrier concentration of the p-contact layer is preferably between 20.0E18 to 40.0E18 cm$^3$. It is more preferable that the amount of diffusion preventing dopant in the p-contact layer is equal to the amount of dopant in the p-BDR layer. However, any amount of diffusion preventing dopant distributed in any manner within the p-contact layer can provide some dopant diffusion preventing effect.

Although the semiconductor laser of the present embodiment has a single quantum well structure (i.e., has a single quantum well), the present invention is not limited to this particular type of semiconductor laser. The present invention can be applied to semiconductor lasers having a multiquantum well structure (i.e., having a plurality of quantum wells), with the same effect.

Further, although in the present embodiment the guiding layers 5 and 7 and the well layer 6 are formed of AlGaAs, in other embodiments they may be formed of a different material. Such layers may still achieve the effect of the invention if the semiconductor laser having a quantum well structure of guiding layer/well layer/guiding layer oscillates at a wavelength of 775 nm-785 nm.

Further, although in the present embodiment the cladding layer 3 is formed of InGaP, in other embodiments it may be formed of AlGaInP, with the same effect.

Further, although in the present embodiment the contact layer 13 is intrinsically doped with C (as described above), in other embodiments it may be intentionally doped. For example, carbon tetrachloride (CCl$_4$), boron tetrachloride (CBr$_4$), etc. may be introduced to dope the contact layer 13 with C (intentional doping).

Figure 7:
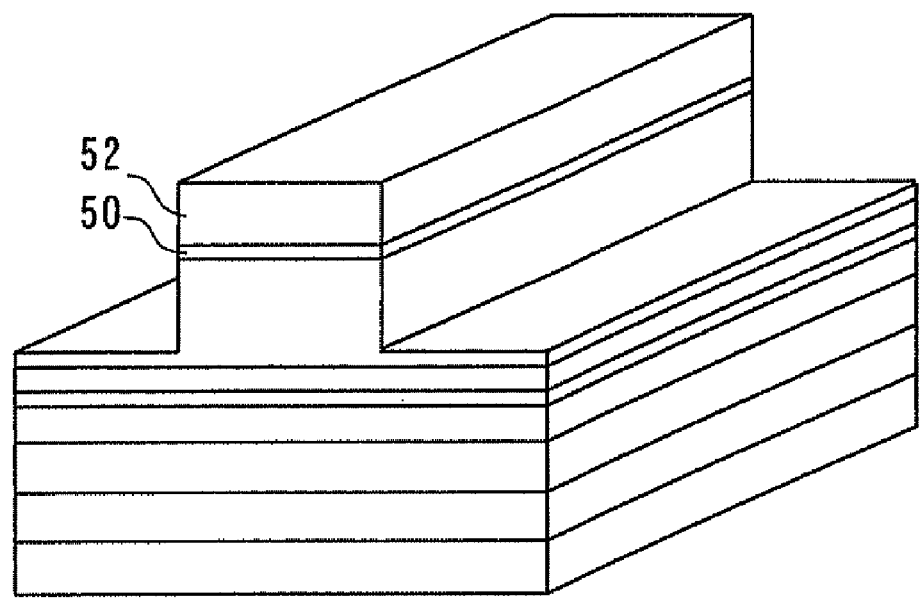
FIG. 7 shows an exemplary ridge waveguide laser.
Figure 8:
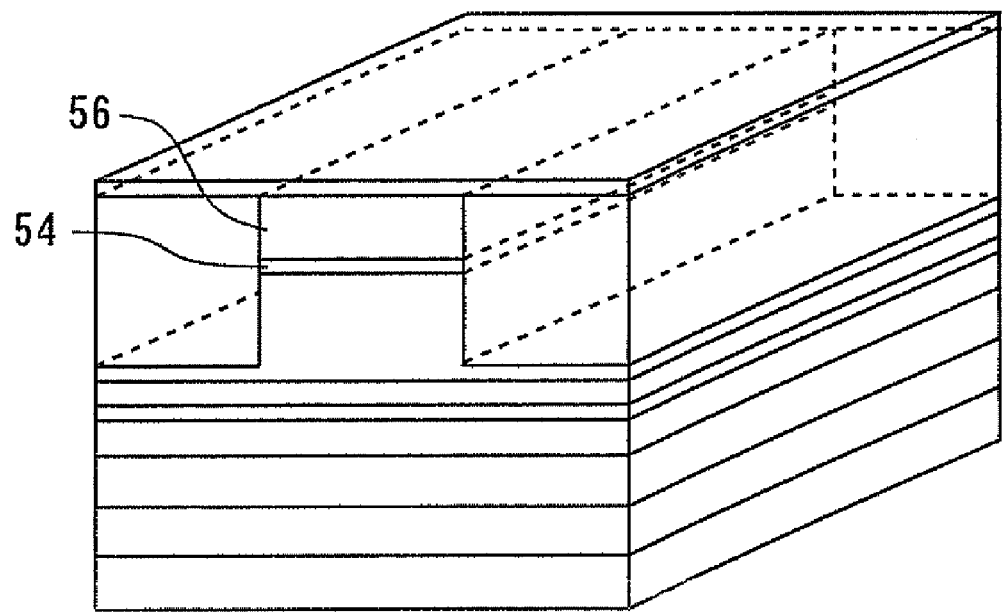
FIG. 8 shows an exemplary buried-ridge laser having a current confinement structure.

FIG. 7 shows an exemplary ridge waveguide laser, which includes a p-BDR layer 50 and a p-contact layer 52. Further, FIG. 8 shows an exemplary buried-ridge laser having a current confinement structure, which includes a p-BDR layer 54 and a p-contact layer 56. The present invention can also be applied to these types of semiconductor lasers, with the same effect.

While the present embodiment has been described with reference to semiconductor lasers, it should be understood that the present invention is not limited to semiconductor lasers. The invention can also be applied to other semiconductor optical devices such as LEDs (Light Emitting Diodes), with the same effect. In these semiconductor optical devices, too, dopant diffusion from the BDR layer can be precluded by doping the contact layer with a diffusion preventing dopant.

Although the present embodiment has been described with reference to semiconductor lasers having an oscillation wavelength of 775-785 nm (as shown in FIG. 2), the embodiment is not limited to these semiconductor lasers. The present invention can be applied to semiconductor lasers having an oscillation wavelength of approximately 1250-1580 nm (as shown in FIGS. 9, 10, and 11), with the same effect. In these semiconductor lasers, too, dopant diffusion from the BDR layer can be precluded by doping the contact layer with a diffusion preventing dopant. It should be noted that although the semiconductor lasers of FIGS. 9, 10, and 11 are shown to be formed primarily of InGaAsP, in other embodiments they may be formed primarily of AlGaInAs. Further, although these semiconductor lasers are shown to contain S as an n-type dopant, in other embodiments they may contain other dopant and may still achieve the effect of the invention.

Although the present embodiment has been described with reference to semiconductor lasers having a BDR layer, the embodiment is not limited to such semiconductor lasers. The present invention can be applied to semiconductor lasers having plural BDR layers without losing the effect of this invention.

The features and advantages of the present invention may be summarized as follows.

As described above, the present invention provides a method for manufacturing a semiconductor optical device in such a way that the operating resistance of the device does not deviate from the design value.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2007-068538, filed on Mar. 16, 2007 including specification, claims, drawings and summary, on which the Convention priority of the present application is based, are incorporated herein by reference in its entirety.

What is claimed is:

1. A method for manufacturing a semiconductor optical device, comprising:
   forming a semiconductor cladding layer having a first energy bandgap;
   forming a Band Discontinuity Reduction (BDR) semiconductor layer in contact with said semiconductor cladding layer, having a first conductivity type, doped with a first impurity, and having a second energy bandgap smaller than the first energy bandgap;
   depositing a semiconductor contact layer having the first conductivity type, in contact with said BDR layer, after formation of said BDR layer, said semiconductor contact layer having a third energy bandgap, smaller than the second energy bandgap, doped with said first impurity and a second impurity, and used to form an electrode; and
   heat treating after forming said semiconductor contact layer.

2. The method as claimed in claim 1, wherein
   the first conductivity type is p-type,
   said first impurity is an element selected from the group consisting of Mg, Be, and Zn,
   said semiconductor contact layer is GaAs, and
   said BDR semiconductor layer is InGaP.

3. The method as claimed in claim 1, wherein
   the first conductivity type is p-type,
   said first impurity is an element selected from the group consisting of Mg, Be, and Zn,
   said semiconductor contact layer is InGaAs, and
   said BDR semiconductor layer is InGaAsP.

4. The method as claimed in claim 1, wherein said second impurity is C.

5. The method as claimed in claim 4, wherein said contact layer is intrinsically doped with said second impurity.

* * * * *